United States Patent [19]

Chappell et al.

[11] Patent Number: 4,697,108
[45] Date of Patent: Sep. 29, 1987

[54] COMPLEMENTARY INPUT CIRCUIT WITH NONLINEAR FRONT END AND PARTIALLY COUPLED LATCH

[75] Inventors: Barbara A. Chappell, Amawalk; Stanley E. Schuster, Granite Springs, both of N.Y.

[73] Assignee: International Business Machines Corp., Armonk, N.Y.

[21] Appl. No.: 861,166

[22] Filed: May 9, 1986

[51] Int. Cl.⁴ .......................................... H03K 19/096
[52] U.S. Cl. ..................................... 307/475; 307/496; 307/362; 307/585; 307/279
[58] Field of Search ............... 307/443, 451, 475, 490, 307/496, 497, 500, 501, 354, 362, 264, 585, 279, 291

[56] References Cited

U.S. PATENT DOCUMENTS

| | | | |
|---|---|---|---|
| 3,457,435 | 7/1969 | Burns et al. | 307/585 |
| 4,080,539 | 3/1978 | Stewart | 307/270 X |
| 4,146,802 | 3/1979 | Moench | 307/279 |
| 4,251,739 | 2/1981 | Morozumi | 307/279 X |
| 4,321,491 | 3/1982 | Atherton et al. | 307/279 X |
| 4,489,284 | 12/1984 | Charpentier et al. | 307/279 X |
| 4,501,978 | 2/1985 | Gentile et al. | 307/279 X |

FOREIGN PATENT DOCUMENTS 0010059  1/1977  Japan ................................ 307/585

Primary Examiner—Stanley D. Miller
Assistant Examiner—D. R. Hudspeth
Attorney, Agent, or Firm—C. Lamont Whitham

[57] ABSTRACT

A complementary input circuit with a nonlinear front end is used to transfer the state of an external input to the internal signal lines of an intetraged circuit chip such as a dynamic or static RAM. The combination of a nonlinear front end and a "partially" cross-coupled complementary latch provide good level detection.

5 Claims, 4 Drawing Figures

COMPLEMENTARY INPUT CIRCUIT WITH NONLINEAR FRONT END AND PARTIALLY COUPLED LATCH

BACKGROUND OF THE INVENTION

1. Field of the Invention

The present invention generally relates to input circuits and, more particularly, to a complementary input circuit with a nonlinear front end that is used to transfer the state of an external input to the internal signal lines of an integrated circuit chip.

2. Description of the Prior Art

A number of circuits are known in the prior art for converting bipolar logic levels, such as those produced by transistor-transistor logic (TTL) circuits, to field effect transistor (FET) logic levels. The need for such converter circuits arises because both TTL and FET circuits are used in modern data processing systems. For example, static and dynamic random access memories (RAMs) are typically fabricated with FETs in an integrated circuit form and have advantages of dense integration and low power dissipation. Bipolar logic circuits, however, have higher operating speed and are therefore frequently used for the control logic circuits for the main memories. Thus, there is a continuing need for improved interfaces between bipolar and FET circuits to overcome otherwise incompatible logic voltage levels.

Representative prior patents and publications are listed hereinbelow to indicate the state of the art.

U.S. Pat. No. 4,441,039 issued Apr. 3, 1984, to Schuster, entitled "Input Buffer for Semiconductor Memory", discloses an address input buffer for a cross-coupled latch of the type including two switching transistors. The address input buffer circuit includes a first depletion device having its source electrode connected to one latch node and the address input voltage connected to its gate. A second depletion device has its source electrode connected to the other latch node and to its gate. The voltage differential across the latch is a function of the variable current difference between the two depletion devices because the gate to source voltage of one depletion device is constant and the gate to source voltage of the other depletion device is variable in accordance with the level of the address input voltage. Thus, the address input voltage is not compared with a fixed reference voltage, and no capacitive boosting of a reference and address voltage is necessary to turn on the latch.

U.S. Pat. No. 4,418,401 issued Nov. 29, 1983 to Bansal, entitled "Latent Image RAM Cell", shows a partially cross-coupled RAM cell which will have a predictable initial storage state when pulsed drain voltage is turned on and, yet after the initial turn-on interval, will operate in a symmetric fashion storing either binary ones or zeros.

U.S. Pat. No. 4,406,956 issued Sep. 27, 1983 to Clemen et al, entitled "FET Circuit for Converting TTL to FET Logic Levels", shows a level converter circuit having first and second field effect transistors having their source and gate electrodes connected in common. The bipolar input signal is received at the common source connection while the gate electrodes receive a fixed reference potential that is equal to the threshold voltage plus the lowest possible high binary level of the bipolar input logic. The drain electrode of the first FET is connected to the output terminal of the level converter and the source electrode of a source follower FET. The drain electrode of the second FET is connected to a load device and to the gate of the source follower FET.

IBM Technical Disclosure Bulletin by Bernstein et al, entitled "TTL to FET Logic Level Converter", vol. 22, no. 8B, Jan. 1980, pp. 3751-2, shows an FET which receives an input signal and functions as a comparator using a reference voltage. The threshold voltage considerations for the input FET are diminished by applying a gate voltage that equals the desired reference voltage plus the threshold voltage of a second FET that is on the same chip as the input FET.

SUMMARY OF THE INVENTION

It is therefore an object of this invention to provide a fast, low power input circuit having good level detection for transfering the state of an external input to the internal signal lines of an integrated circuit chip.

It is another object of the invention to provide an input circuit which is particularly useful for both dynamic and static CMOS RAMs and is characterized by minimal skew between address transitions for various input conditions.

According to the present invention, there is provided a complementary input circuit having a nonlinear front end and a "partially" cross-coupled latch. The nonlinear front end does not provide an output voltage until the input voltage exceeds a reference voltage plus a threshold voltage. In standby with the precharge voltage high, both output nodes of the "partially" cross-coupled latch are clamped low. A cycle is initiated by the precharge voltage going low. The "partially" cross-coupled latch is sensitive to even weak levels of input voltage to affect a voltage transfer to the integrated circuit chip without d.c. power dissipation after transfer is complete. The combination of the nonlinear front end and "partially" cross-coupled latch gives good level detection, minimal skew between address transitions, and fast performance with low power.

BRIEF DESCRIPTION OF THE DRAWINGS

The foregoing and other objects, advantages and aspects of the invention will be better understood from the following detailed description of the invention with reference to the drawings, in which.

DETAILED DESCRIPTION OF THE PREFERRED EMBODIMENT OF THE INVENTION

Figure 1:
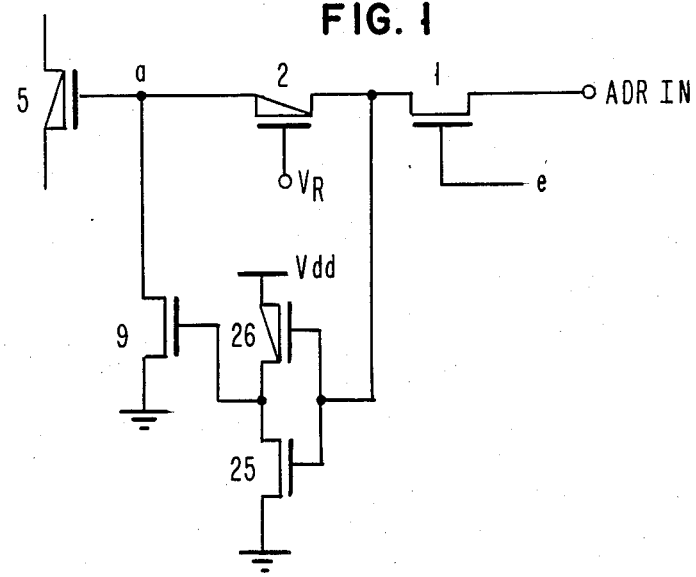
FIG. 1 is a schematic diagram of a simplified nonlinear front end circuit according to the present invention.
Figure 2:
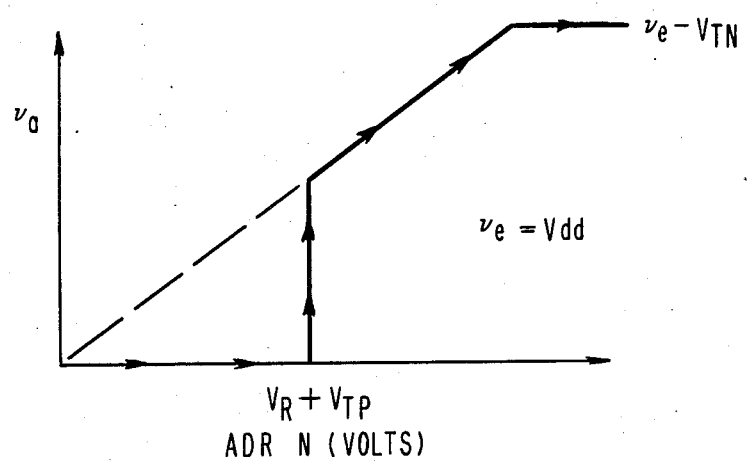
FIG. 2 is a graph showing the nonlinear operating characteristic of the circuit shown in FIG. 1.

Circuit operation and novel features of the invention can be best understood by first considering the simplified circuit diagram of FIG. 1 together with the graph shown in FIG. 2. The nonlinear front end circuit comprises n-channel field effect transistor (FET) device 1 and p-channel FET device 2 having their source and drain electrodes connected in series between node a and the address input (Adr In) voltage terminal. A reference voltage $V_R$ is connected to the gate of FET device 2, and the output of the nonlinear front end circuit is connected to the gate of FET device 1 at node e. In addition, an n-channel FET device 9 is connected between node a and ground. The gate of FET device 9 is driven by an inverter consisting of complementary n-channel and p-channel FET devices 25 and 26, respectively, the gates of which are connected to the common connection of the drains of FET devices 1 and 2.

The basic concept of the nonlinear front end circuit shown in FIG. 1 is to fix the input level at node a at ground unless the input voltage exceeds a reference voltage, $V_R$, plus the p-channel threshold voltage, $V_{TP}$, of FET device 2, as shown in FIG. 2. For this latter condition, the voltage at node a will equal the Adr In voltage for voltages less than a threshold voltage below the voltage on node e and will remain at a threshold voltage below node e if the Adr In voltage rises to a higher voltage level. During the precharge portion of the cycle, FET device 1 is on. Node a will discharge to ground through FET device 9 if the Adr In voltage is less than $V_R+V_{TP}$. For this input condition, FET device 2 is off and the output of the inverter consisting of FET devices 25 and 26 is high, clamping node a to ground. If the Adr In voltage is greater than $V_R+V_{TP}$, the inverter output from FET devices 25 and 26 is low, FET device 9 will be off, and node a will go to the Adr In voltage (or to $Ve-V_T$) through on FET device 2. Thus, the nonlinear front end circuit has the voltage characteristics shown in FIG. 2.

Figure 3:
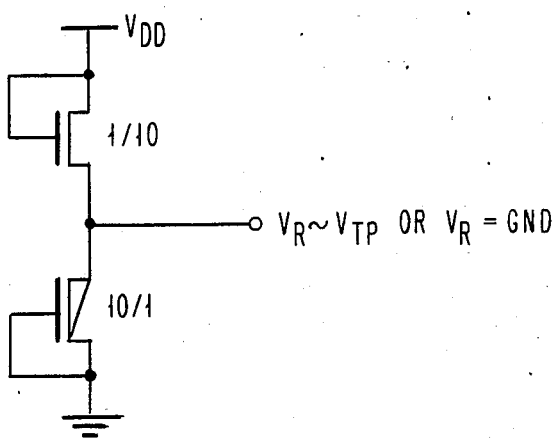
FIG. 3 is a schematic diagram of a simple circuit which generates a reference voltage.

The reference voltage can either be ground potential or some other voltage. An example of a simple circuit which generates a reference potential approximately equal to a p-channel threshold voltage is shown in FIG. 3. This reference generator consists of complementary n-channel and p-channel diode connected FET devices in series between a source of voltage $V_{dd}$ and ground and will dissipate a small amount of d.c. power.

Figure 4:
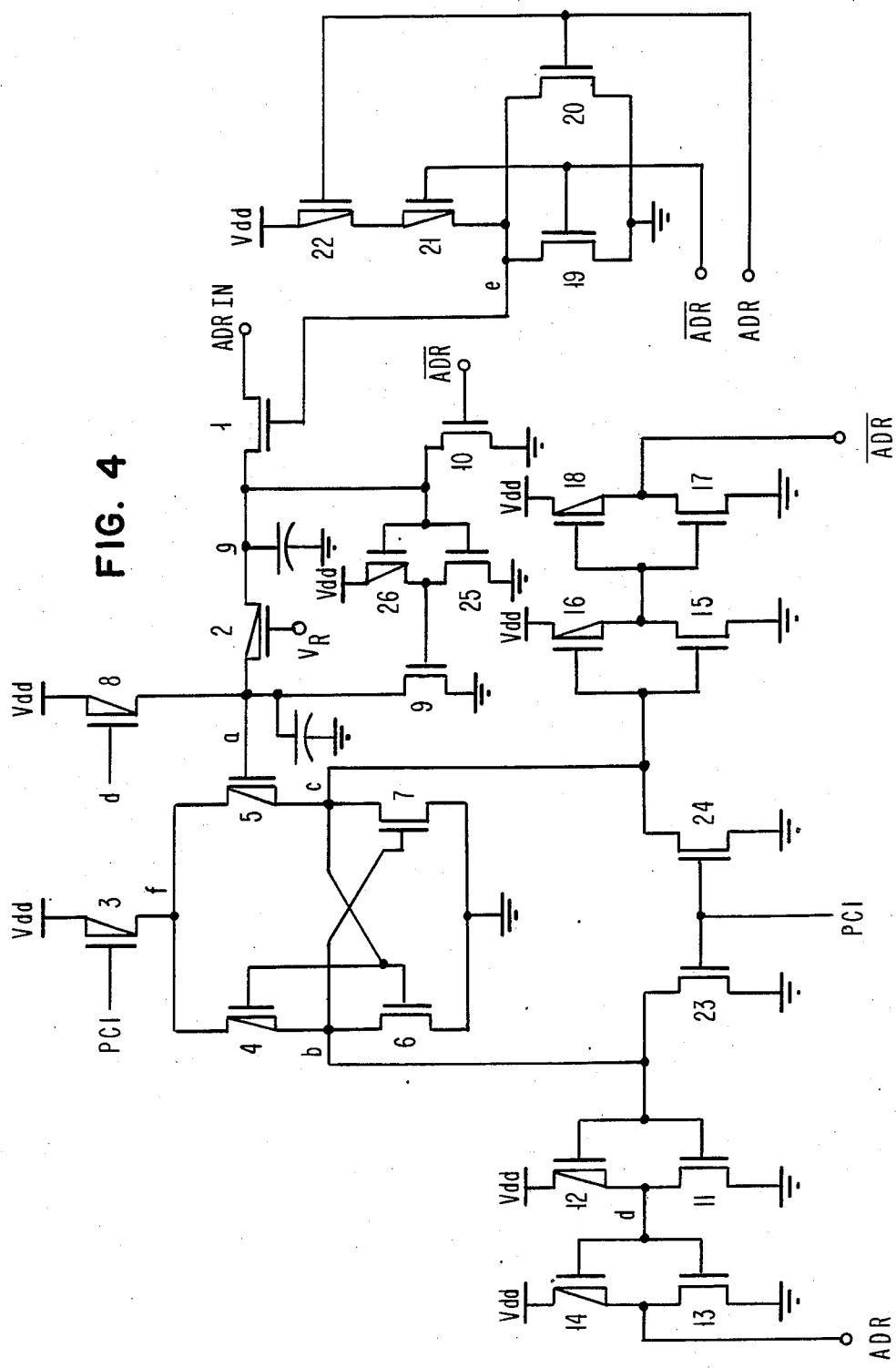
FIG. 4 is a schematic diagram of the input circuit according to the invention incorporating the nonlinear front end circuit of FIG. 1.

The combination of the nonlinear front end shown in FIG. 1 and a "partially" cross-coupled complementary latch is shown in FIG. 4. The complementary latch comprises a pair of p-channel FET devices 4 and 5 respectively connected in series with a pair of n-channel FET devices 6 and 7 between node f and ground. The complementary latch is "partially" cross-coupled since the gate of p-channel FET device 5 is not connected to the opposite node b of the latch but to node a and hence the Adr In voltage through the nonlinear front end circuit. Node f of the latch is connected to a source of voltage $V_{dd}$ through a p-channel FET device 3. The gate of FET device 3 is connected to a precharge input PCl.

The opposite output nodes b and c of the "partially" cross-coupled latch are connected to respective inverter/driver pairs. More specifically, a first inverter/driver consisting of complementary n-channel and p-channel FET devices 11 and 12, respectively, is connected between node b and a second inverter/driver consisting of complementary n-channel and p-channel FET devices 13 and 14, respectively. The output of the second inverter/driver is connected to the internal address line (ADR) of the integrated circuit chip. A third inverter/driver consisting of complementary n-channel and p-channel FET devices 15 and 16, respectively, and a fourth inverter/driver consisting of n-channel and p-channel FET devices 17 and 18, respectively, couple node c of the latch to the complement or $\overline{ADR}$ internal address line. In addition, nodes b and c of the latch are connected via n-channel FET devices 23 and 24 to ground. The gates of FET devices 23 and 24 are connected in common to the precharge input PCl.

To complete the circuit description of the input circuit shown in FIG. 4, node a is connected to the drain of a p-channel FET device 8, the source of which is connected to the voltage $V_{dd}$ and the gate of which is connected to node d. Node d is the output of the inverter consisting of FET devices 11 and 12. Node e of the nonlinear input circuit is connected to a circuit consisting of n-channel FET devices 19 and 20 and p-channel FET devices 21 and 22. FET devices 21 and 22 are connected in series between a source of voltage $V_{dd}$ and node e, while FET devices 19 and 20 are connected in parallel between node e and ground. The gates of FET devices 19 and 21 are connected in common to the internal address line $\overline{ADR}$, and the gates of FET devices 20 and 22 are connected in common with the internal address line ADR. Finally, node g, the common connection of the sources of FET devices 1 and 2, is coupled to ground via n-channel FET device 10, the gate of which is connected to the internal address line $\overline{ADR}$.

In standby, PCl is high, clamping nodes b and c of the latch low through FET devices 23 and 24. FET device 3 is off, with PCl high. An active cycle is initiated by PCl going low, causing n-channel FET devices 23 and 24 to turn off and p-channel FET device 3 to turn on.

Consider first the case where the voltage on node a of the nonlinear front end is high; i.e., the Adr In voltage is greater than $V_R+V_{TP}$. As PCl falls, FET device 3 will turn on and node f, the common connection of the sources of p-channel FET devices 4 and 5, will start to rise. FET device 4 will turn on as soon as node f is a p-channel threshold voltage above ground, since its gate is connected to node c, which is at ground potential. However, FET device 5 will remain off until node f is a threshold voltage higher than the voltage on node a ($V_{TP}$+Adr In). When FET device 4 turns on, node b will start to rise. As soon as the voltage on node b reaches the threshold voltage of FET device 7, node c will be effectively held at ground potential by FET device 7 which is on. In addition, node b rising will cause the inverter/driver stage consisting of FET devices 11 and 12 to switch state. As node d (the output of the inverter/driver stage) falls, the internal address line, ADR, will go high as a result of FET devices 13 and 14 of the next inverter/driver stage changing state. Also as node d falls, FET device 8 (which has its drain connected to node a) will turn on and pull node a toward $V_{dd}$. When the internal address line ADR goes high, the stage consisting of FET devices 19, 20, 21, and 22 will also change state. As its output node e falls, FET device 1 turns off and node a is free to rise to $V_{dd}$. The final state of the "partially" cross coupled complementary latch for a high Adr In voltage will have node b at $V_{dd}$ and node c at ground. There is no d.c. power dissipation after the transfer is complete even for a weak level on Adr In.

Next, consider the case where the voltage on node a of the nonlinear front end is at ground (the Adr In voltage is less than $V_R+V_{TP}$) at the beginning of a cycle. As PCl goes low, turning on FET device 3, node f will start to rise. Both FET devices 4 and 5 will begin to turn on, when node f rises to a p-channel threshold above nodes a and c. Node a is essentially fixed at ground potential, but the voltage on node c will rise as FET device 5 turns on. Therefore, FET device 4, which has rising node c as its gate, will be less conductive than FET device 5. This will result in node b charging at a slower rate than node c and the "partially" coupled latch comprising FET devices 6 and 7 setting with node c high and node b low. Node c will charge to $V_{dd}$ and node b will be clamped to ground through FET device 6. Note that under these conditions, FET device 4 is off. The internal address line $\overline{ADR}$ will go high as a result of node c rising and node a will be decoupled from Adr In when FET device 1 turns off as previously described. Node g will be clamped to ground through FET device 10 and node a will also be held at a good low level through FET device 9, since the output of the inverter consisting of FET devices 25 and 26 is high when internal address line $\overline{ADR}$ goes high.

The operation of a complementary input circuit with a nonlinear front end has been described. The combination of the nonlinear front end and the "partially" cross coupled latch gives good level detection, minimal skew between address transitions, and fast performance while consuming low power. Those skilled in the art will understand that the invention has been described in terms of a preferred embodiment only and that the invention can be practiced with modification and variation within the scope and spirit of the appended claims.

Having thus described our invention, what we claim as new and desire to secure by Letters Patent is as follows:

1. An input circuit for transferring the state of an input external to an integrated circuit chip to the internal signal lines of the integrated circuit chip comprising:
   a nonlinear input circuit having an input terminal for receiving an external input and providing an output to a first node only when the external input exceeds a reference voltage plus a threshold voltage, said nonlinear input circuit including first and second complementary conductivity transistor devices connected in series between said input terminal and said first node, each of said first and second transistor devices having a control input terminal, the control input terminal of said first transistor device being connected to a control node for turning said first transistor device off after voltage transfer is complete and the control input terminal of said second transistor device being connected to a reference voltage source; and
   latch means including third and fourth complementary conductivity transistor devices connected in series between a common node and ground and fifth and sixth complementary conductivity transistor devices connected in series between said common node and ground, the common connections between said third and fourth transistor devices and between said fifth and sixth transistor devices being first and second output nodes, respectively, of said latch means, said first and second output nodes being connected to the internal signal lines of the integrated circuit chip, each of said third, fourth, fifth and sixth transistor devices having a control electrode, the control electrode of said third transistor device being connected to said second output node of said latch means which is the common connection between said first and sixth transistor devices, the control electrodes of said fifth and sixth transistor devices being connected to said first output node of said latch means which is the common connection between said third and fourth transistor devices, and the control electrode of said fourth transistor device being connected to said first node.

2. The input circuit recited in claim 18 further comprising:
   a seventh transistor device connected between said common node and a source of voltage, said seventh transistor device hvaing a control electrode connected to a precharge voltage source; and
   eighth and ninth transistor devices of complementary conductivity to said seventh transistor device respectively connected in series between said output nodes and ground, said eighth and ninth transistor devices having control electrodes connected to said precharge voltage source.

3. The input circuit recited in claim 2 further comprising:
   first and second inverter/driver means respectively connected to said output nodes of said latch means to provide first and second internal outputs;
   a tenth transistor device connected to said first node and said source of voltage, said tenth transistor device having a control electrode connected to said first inverter/driver means; and
   switching circuit means connected to said first and second internal outputs for generating a control voltage for said control node of said nonlinear input circuit.

4. The input circuit recited in claim 3 wherein said nonlinear input circuit further includes an inverter connected to the common connection between said first and second transistor devices and an eleventh transistor device connected in series between said first node and ground, said inverter having an output and eleventh transistor device having a control electrode connected to the output of said inverter.

5. The input circuit recited in claim 4 further comprising a twelth transistor device connected in series between the common connection of said first and second transistor devices and ground, said twelth transistor device having a control electrode connected to said second internal output.

* * * * *